US008513943B2

(12) United States Patent
Gehlen et al.

(10) Patent No.: US 8,513,943 B2
(45) Date of Patent: Aug. 20, 2013

(54) APPARATUS, SYSTEM, AND METHOD FOR SCANNING A SURFACE

(75) Inventors: Mark Gehlen, Pasco, WA (US); Gary Brockman, Kennewick, WA (US); Steve Hubbard, Pasco, WA (US)

(73) Assignee: United Western Technologies Corporation, Kennewick, WA (US)

(*) Notice: Subject to any disclaimer, the term of this patent is extended or adjusted under 35 U.S.C. 154(b) by 483 days.

(21) Appl. No.: 12/862,620

(22) Filed: Aug. 24, 2010

(65) Prior Publication Data

US 2012/0048052 A1 Mar. 1, 2012

(51) Int. Cl.
*G01N 27/82* (2006.01)
*G01R 33/12* (2006.01)

(52) U.S. Cl.
USPC ............ 324/237; 324/238; 324/240; 324/239

(58) Field of Classification Search
None
See application file for complete search history.

(56) References Cited

U.S. PATENT DOCUMENTS

| | | | | |
|---|---|---|---|---|
| 4,271,393 | A | 6/1981 | Hansen et al. | |
| 4,622,517 | A | 11/1986 | Arnaud et al. | |
| 4,677,379 | A | 6/1987 | Arnaud et al. | |
| 4,814,705 | A | 3/1989 | Saunderson | |
| 5,298,858 | A * | 3/1994 | Harrison | 324/235 |
| 5,485,084 | A | 1/1996 | Duncan et al. | |
| 5,510,709 | A | 4/1996 | Hurley et al. | |
| 5,781,007 | A * | 7/1998 | Partika et al. | 324/220 |
| 6,014,024 | A | 1/2000 | Hockey et al. | |
| 6,271,664 | B1 | 8/2001 | Logue | |
| 6,636,037 | B1 | 10/2003 | Ou-Yang | |
| 7,155,307 | B2 * | 12/2006 | Seemann | 700/245 |
| 7,352,176 | B1 | 4/2008 | Roach et al. | |
| 7,375,514 | B2 | 5/2008 | Rempt et al. | |
| 7,542,871 | B2 * | 6/2009 | Rempt et al. | 702/168 |
| 7,560,920 | B1 | 7/2009 | Ouyang et al. | |
| 7,626,383 | B1 | 12/2009 | Sun et al. | |
| 2003/0164700 | A1 | 9/2003 | Goldfine et al. | |
| 2009/0302835 | A1 | 12/2009 | Sun et al. | |
| 2010/0013468 | A1 | 1/2010 | Joubert et al. | |
| 2010/0045276 | A1 | 2/2010 | Udpa et al. | |

FOREIGN PATENT DOCUMENTS

EP 1798550 A1 6/2007

* cited by examiner

*Primary Examiner* — Jay Patidar
(74) *Attorney, Agent, or Firm* — Goucher Patent Law, PLCC; Tyler Goucher

(57) ABSTRACT

An apparatus, system, and method are disclosed for maintaining normalcy of a sensor with respect to a structure. The apparatus includes a driving member, a driven member, and a sensor. The driving member includes a first engaging element and a second engaging element. The driven member includes a third engaging element and a fourth engaging element. The third engaging element of the driven member is engaged with the first engaging element of the driving member. The fourth engaging element of the driven member is engaged with the second engaging element of the driving member. The sensor is coupled to the driven member, which is rotatably drivable by the driving member. Engagement between the first and third engaging elements facilitates three-dimensional adjustment of the driven member relative to the driving member. Engagement between the second and fourth engaging elements facilitates co-rotation of the driving member and the driven member.

20 Claims, 9 Drawing Sheets

APPARATUS, SYSTEM, AND METHOD FOR SCANNING A SURFACE

FIELD

The subject matter of the present disclosure relates to scanning surfaces and more particularly relates to scanning the metallic surfaces of aircraft.

BACKGROUND

Aircraft require a high level of maintenance and care to assure their safe use. Most aircraft comprise a metallic fuselage that is held together by metallic rivets. Both the fuselage and the rivets may occasionally require scanning to determine if weaknesses have developed within the metal.

Aircraft surface scanning may be accomplished using a sensor that detects changes in eddy currents as the sensor is passed over the surface of the aircraft. To avoid variations in the feedback from the sensor the sensor may be maintained at approximately the same distance from the surface of the aircraft as the sensor is passed over the surface of the aircraft. Difficulties arise in maintaining the sensor at approximately the same distance from the surface of the aircraft due to variations in the angle of the surface of the aircraft.

SUMMARY

From the foregoing discussion, it should be apparent that a need exists for an improved apparatus, system, and method for scanning the surface of an aircraft. Beneficially, such an apparatus, system, and method would allow for efficient scanning of an aircraft while taking into account various angles of the surface.

The subject matter of the present disclosure has been developed in response to the present state of the art, and in particular, in response to the problems and needs in the art that have not yet been fully solved by currently available technology. Accordingly, the present subject matter has been developed to provide a portable inspection system, and associated apparatus and method for the inspection of aircraft surfaces that overcome many or all of the above-discussed shortcomings in the art.

An apparatus is disclosed for maintaining normalcy of a sensor with respect to a structure. The apparatus, in one embodiment, includes a driving member, a driven member, and a sensor. The driving member includes a first engaging element and a second engaging element. The driven member includes a third engaging element and a fourth engaging element.

In one embodiment, the third engaging element of the driven member is engaged with the first engaging element of the driving member. The fourth engaging element of the driven member is engaged with the second engaging element of the driving member. In certain embodiments, the sensor is coupled to the driven member which is rotatably drivable by the driving member. In one embodiment, the sensor is an eddy current sensor that senses changes in eddy currents.

Engagement between the first and third engaging elements, in one embodiment, facilitates three-dimensional adjustment of the driven member relative to the driving member. Engagement between the second and fourth engaging elements facilitates co-rotation of the driving member and the driven member.

In one embodiment, one of the first engaging elements and the third engaging element is a head and the other of the first engaging element and the third engaging element is a head receiving space. In certain embodiments, the head is received within the head receiving space to engage the first engaging element with the third engaging element.

In certain embodiments, the head receiving space is defined by an inner wall and one of the second engaging element and the fourth engaging element is a slot formed in the inner wall. The slot is elongated in a lengthwise direction substantially parallel to an axis of rotation of the driven member. The other of the second engaging element and the fourth engaging element is a pinning member received within and movable along the slot in the lengthwise direction.

In a further embodiment, the apparatus may include a capping member having a shaft receiving space. The capping member is coupled to one of the driving member and the driven member and the other of the driving member and the driven member is a shaft positioned within the shaft receiving space. In one embodiment, the shaft receiving space has a minimum dimension less than a maximum dimension of the head such that the capping member maintains the head within the head receiving space.

In one embodiment, a slot is formed in an inner wall defining the shaft receiving space. The slot formed in the inner wall of the capping member communicates with a slot formed in an inner wall in one of the of the driving member and the driven member such that a pinning member is moveable between the slot formed in the inner wall of the capping member and the slot formed in the inner wall in one of the of the driving member and the driven member.

In certain embodiments, at least a portion of the head is convex. In one embodiment, at least a portion of the shaft receiving space includes a concave surface. The convex portion of the head is matingly nestable with the convex surface of the head.

In one embodiment, the capping member includes a shaft receiving surface and a head engagement surface. The shaft receiving space within the capping member extends between a first opening in the shaft receiving surface and a second opening in the head engagement surface. In certain embodiments, the shaft receiving space is defined by an inner wall having a shaft receiving portion and a head engagement portion. The shaft receiving portion of the inner wall extends from the shaft receiving surface to an interface between the shaft receiving portion and the head engagement portion. In one embodiment, the diameter of the first opening is substantially larger than the diameter of the shaft receiving space at the interface between the shaft receiving portion and the head engagement portion such that the shaft receiving portion of the shaft receiving space is substantially conical. The conical shaft receiving portion of the shaft receiving space accommodates the shaft as the orientation of the driven member relative to the driving member is adjusted.

The driven member, in certain embodiments, includes a scanning surface. The driven member adjusts to position the scanning surface in a plane parallel to a surface of a scanned structure. In one embodiment, the three-dimensional adjustment of the orientation of the driven member relative to the driving member facilitates movement of the driven member about an infinite number of axes of rotation such that the driven member maintains normalcy with respect to a scanned structure. In certain embodiments, a biasing member is coupled to the driving member and engageable with the driven member. The biasing member biases the driven member into a position substantially perpendicular to the driving member.

In one embodiment, a guard ring is position around an outer periphery of the driven member. The guard ring protects the driven member and the sensor from damage as the driven member is positioned over the scanned structure and rotated. In certain embodiments, the driven member is rotatable within the guard ring.

The apparatus, in one embodiment, also includes a chassis, a guard ring engaging member, and a guard ring slot. The guard ring slot is elongated in a lengthwise direction substantially perpendicular to an axis of rotation of the driven member and is formed in one of the chassis and an outer wall of the guard ring. The guard ring engaging element is coupled to the other of the chassis and the guard ring. In certain embodiments, the guard ring engaging member is engageable with and movable along the guard ring slot in the lengthwise direction such that the guard ring is positioned in a fixed rotational position relative to the chassis.

An apparatus for maintaining a rotational path of an eddy current sensor parallel with a scanned structure is also disclosed. In certain embodiments, the apparatus includes a driving member, a driven member, an eddy current sensor, and a coupling between the driving member and the driven member.

In one embodiment, the driven member has a substantially planar scanning surface. The driven member is rotatably drivable by the driving member. The eddy current sensor is coupled to the driven member and is configured to sense an eddy current within a scanned structure. The coupling between the driving member and the driven member facilitates three-dimensional adjustment of an orientation of the substantially planar scanning surface of the driven member. In certain embodiments, the coupling between the driving member and the driven member also facilitates co-rotation of the driving member and the driven member.

The driving member, in certain embodiments, includes a first engaging and a second engaging element. In one embodiment, the driven member includes a third engaging element and a fourth engaging element. The third engaging element of the driven member is engageable with the first engaging element of the driving member. The fourth engaging element of the driven member is engageable with the second engaging element of the driving member.

In certain embodiments, one of the first engaging element and the third engaging element is a head and the other of the first engaging element and the third engaging element is a head receiving space. The head is receivable within the head receiving space to facilitate the three-dimensional adjustment of the orientation of the substantially planar scanning surface of the driven member.

In a further embodiment, one of the second engaging element and the fourth engaging element is a slot formed in the head receiving space and the other of the second engaging element and the fourth engaging element is a pinning member. The slot is elongated in a lengthwise direction substantially parallel to an axis of rotation of the driven member. The pinning member is received within and movable along the slot in the lengthwise direction. Engagement between the pinning member and the slot facilitates co-rotation of the driving member and the driven member.

A method of the present subject matter is also presented for normalcy of a sensor with respect to a structure. The method in the disclosed embodiments substantially includes the steps necessary to carry out the functions presented above with respect to the operation of the described apparatus and system. For example, according to one embodiment, the method includes positioning a scanner on a structure, engaging a first engaging element with a third engaging element, engaging a second engaging element with a fourth engaging element, and rotating a driving member to rotate the driven member.

In certain embodiments, engagement between the first engaging element and the third engaging element facilitates three-dimensional adjustment of an orientation of the driven member relative to the driving member. Engagement between the second engaging element and the fourth engaging element facilitates co-rotation of the driving member and the driven member.

Reference throughout this specification to features, advantages, or similar language does not imply that all of the features and advantages that may be realized with the present subject matter should be or are in any single embodiment. Rather, language referring to the features and advantages is understood to mean that a specific feature, advantage, or characteristic described in connection with an embodiment is included in at least one embodiment. Thus, discussion of the features and advantages, and similar language, throughout this specification may, but do not necessarily, refer to the same embodiment.

Furthermore, the described features, advantages, and characteristics of the subject matter may be combined in any suitable manner in one or more embodiments. One skilled in the relevant art will recognize that the subject matter may be practiced without one or more of the specific features or advantages of a particular embodiment. In other instances, additional features and advantages may be recognized in certain embodiments that may not be present in all embodiments.

These features and advantages of the present subject matter will become more fully apparent from the following description and appended claims, or may be learned by the practice of the subject matter as set forth hereinafter.

BRIEF DESCRIPTION OF THE DRAWINGS

In order that the advantages of the subject matter will be readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the accompanying drawings, in which.

DETAILED DESCRIPTION

Figure 1:
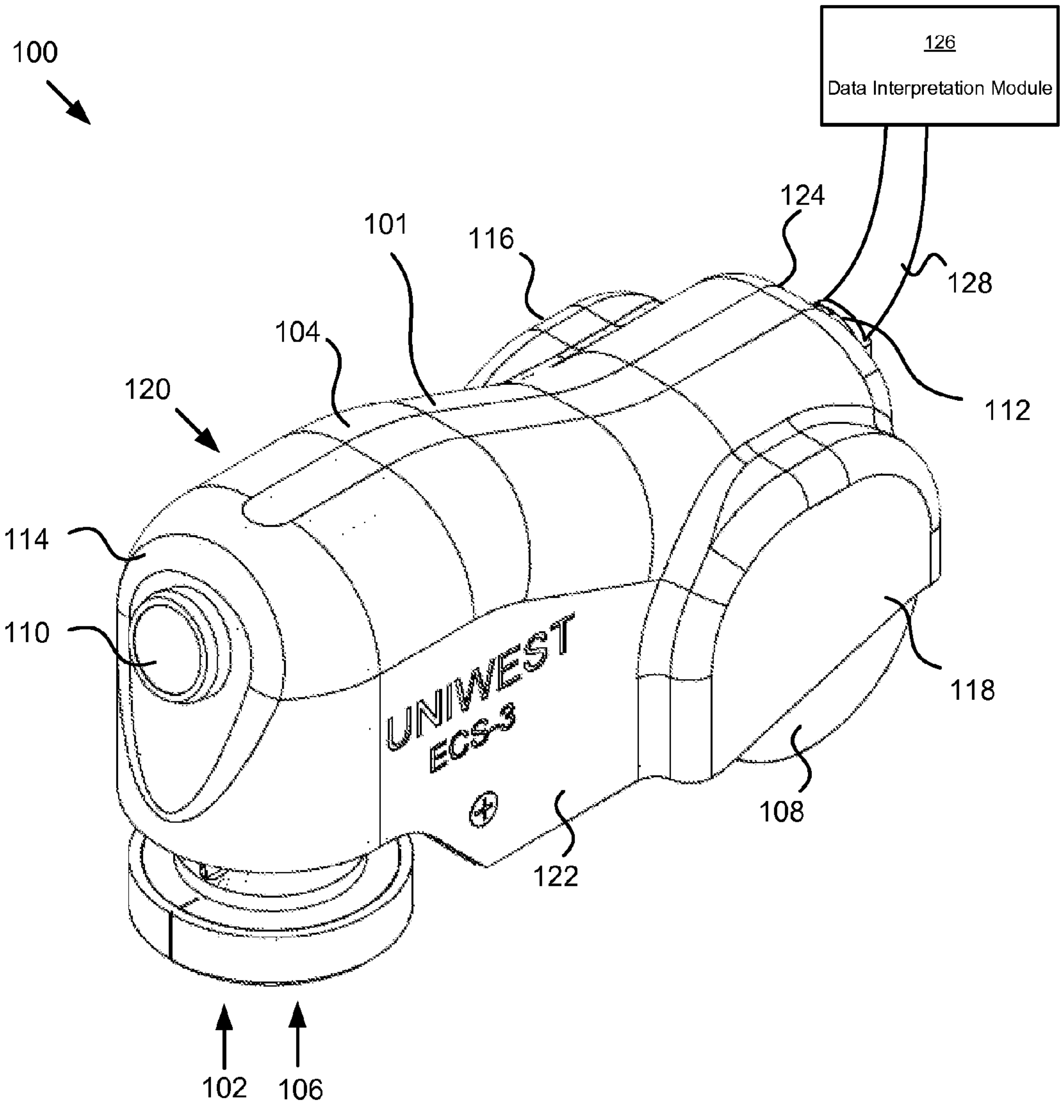
FIG. 1 is a perspective view illustrating one embodiment of an apparatus for maintaining normalcy of a sensor with respect to a structure.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment.

Furthermore, the described features, structures, or characteristics of the subject matter may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the subject matter. One skilled in the relevant art will recognize, however, that the subject matter may be practiced without one or more of the specific details, or with other methods, components, materials, and so forth. In other instances, well-known structures, materials, or operations are not shown or described in detail to avoid obscuring aspects of the subject matter.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present subject matter relates to scanning apparatuses and scanning methods that utilize eddy currents to scan metallic surfaces for weaknesses and deformities. A major industry for such scanning technology is the aeronautical industry. Aircraft require a high level of maintenance and care to assure their safe use. While the present disclosure is directed to scanning an aircraft structure, one of skill in the art will recognize that the apparatuses, systems, and methods discussed herein may be used in scanning any structure.

An eddy current scanning apparatus typically includes at least one generating coil through which a current can run. The generating coil is held in proximity to the metallic surface and parallel to the surface that is to be scanned. A current is generated through the generating coil such that the generating coil induces an electromagnetic field. The magnetic field may then penetrate a metallic surface.

Eddy currents may form if the metallic surface is moved through the generated magnetic field or if the magnetic field is changing. In some embodiments, the eddy currents may be generated by running an AC current through the generating coil and placing the generating coil near the metallic surface. In certain embodiments, an eddy current may be generated by running a DC current through the generating coil and then moving either the generating coil or the metallic surface.

In one embodiment, the generating coil may be positioned on a rotating member adjacent to an axis of rotation of the rotating member. As the rotating member is rotated the generating coil passing over the metallic surface generates an eddy current. The generating coil may be used to measure changes in the generated eddy current by measuring any changes occurring in the current running through the generating coil. These changes may be caused by the current induced in the generating coil by the eddy currents. In one embodiment, a second sensing coil may be used to measure the eddy currents.

As used herein, in embodiments where the generating coil also acts as the eddy current sensor, the generating coil is referred to as a sensor. Similarly, in embodiments where a generating coil is used to generate an eddy current and a sensing coil is used to sense the eddy current, the combination of the generating coil and the sensing coil is referred to as a sensor.

A crack or imperfection in a surface of the scanned structure increases impedance to the eddy current which may be detected by the sensor. Variations in the electrical conductivity or the magnetic permeability of the metallic surface may cause the eddy currents to vary in phase and magnitude. These variations in conductivity and permeability may be caused by weaknesses or abnormalities in the metallic surface. Additionally, the eddy currents will generate their own electromagnetic field, which may in turn induce a current on the sensor. The induced current may also vary in phase and magnitude due to variations in the conductivity and permeability of the metallic surface.

Changes in the amplitude and phase of the current may be interpreted to gain information about the metallic surface. Information that may be gathered includes, but is not limited to, detection of cracks or other imperfections in the structure, measurement of the thickness of a material that makes up the structure, identification of the type of material that makes up the structure, and identification of abnormalities in the material composition that makes up the structure.

In scanning and detecting eddy currents in a structure using a sensor (either a generating and a sensing coil or a generating coil alone) positioned on a rotating member the sensor should be positioned at approximately the same distance away from the structure as the sensor rotates around an axis. Therefore, a surface of the rotating member upon which the sensor is located should be positioned substantially parallel to the surface of the scanned structure. When the surface of the rotating member upon which the sensor is located is disposed parallel to the surface of the scanned structure, the sensor is positioned at a right angle or normal to the scanned surface.

Typically the surface of an aircraft is not uniform and thus, it may be difficult to maintain an eddy current sensor parallel to a surface that is being scanned. The present disclosure teaches an apparatus that maintains the surface of the rotating member upon which the sensor is located parallel to the surface of the scanned structure such that the sensor is positioned normal to the scanned surface. In other words, the rotating member is maintained parallel to a scanned surface such that the sensor is positioned at approximately the same distance away from the structure as the sensor rotates around an axis.

FIG. 1 depicts one embodiment of an apparatus 100 for maintaining normalcy of a sensor with respect to a structure. In certain embodiments the apparatus 100 is a scanner 101 that includes a housing 104, a driven member 106, wheels 108, a switch 110, and a data coupling port 112. In one embodiment, a sensor 204 (not shown in FIG. 1) is positioned on a scanning surface 102 of the driven member 106.

In one embodiment, the housing 104 is made of a substantially rigid material such as a plastic or metallic material. The housing 104 protects the internal components of the apparatus 100 from contamination from dust and debris. In certain embodiments, the housing 104 is contoured to comfortably fit a users palm or hand. The housing 104, in one embodiment, also allows internal components to operate without interference when a user grasps the apparatus 100.

In certain embodiments, the driven member 106 is substantially circular and rotates about an axis. The sensor 204 is positioned on the scanning surface 102 of the driven member 106 at a position adjacent to the axis such that the sensor rotates around the axis when the driven member 106 rotates. While the driven member 106 illustrated in FIG. 1 is depicted as circular, one of skill in the art will recognize that the driven member may have any geometric shape such as a rectangle, square, triangle, etc.

In certain embodiments, the apparatus 100 includes one or more wheels 108 to assist a user in smoothly moving the apparatus. In one embodiment the wheels may also assist a user in maintaining the scanning surface 102 of the driven member a predefined distance from a surface of a scanned structure.

The housing 104 includes flairs 116, 118 that house at least a portion of the wheels 108 to avoid interference between a user's hand or clothing and the wheels 108. In certain embodiments, side portions 120, 122 of the housing 104 are substantially narrower than the flairs 116, 118 to allow the driven member 106 to be inserted into tighter spaces than would otherwise be possible if the housing 104 were the same width as the flairs 116, 118.

As will be evident to one of skill in the art, in certain embodiments, the apparatus 100 may be used to scan a structure having surface that is not uniform. For example, an aircraft structure typically includes a metal frame covered by sheet metal. The sheet metal is coupled to the metal frame by rivets or other fasteners that extend above the surface of the sheet metal. In certain embodiments, the wheels 108, in cooperation with a gliding flange 202 (discussed with reference to FIG. 2) positions the scanning surface 102 of the driven member 106 a sufficient distance above the surface of the scanned structure to clear any rivets or other fasteners extending above the surface of the sheet metal.

In one embodiment, the apparatus 100 includes a switch 110 to turn the apparatus on or off. The switch 110 is located on the housing at a position near where a user grasps the apparatus 100 such that the user can easily access the switch 110. In the embodiment illustrated in FIG. 1, the switch 110 is located near a first end 114 of the apparatus 100 near a position where a user positions his or her index finger. In other embodiments, the switch 110 may be positioned elsewhere on the apparatus 100.

The apparatus 100, in certain embodiments, also includes a data coupling port 112. In one embodiment, the data coupling port 112 is located on a second end 124 of the housing 104. In certain embodiments, the data coupling port 112 is coupled to a data transfer cord 128 that provides feedback from the sensor to a data interpretation module 126. In one embodiment, the data transfer cord 128 may also provide an AC or DC current to the apparatus 100 to power the internal components of the apparatus 100.

In certain embodiments, the data interpretation module 126 includes a display unit that displays the interpreted feedback from the sensor. In one embodiment, the display unit may be an LCD monitor or other imaging unit that displays digital information. In another embodiment, the display unit may be a printer that outputs the interpreted feedback on paper or other physical media.

Figure 2:
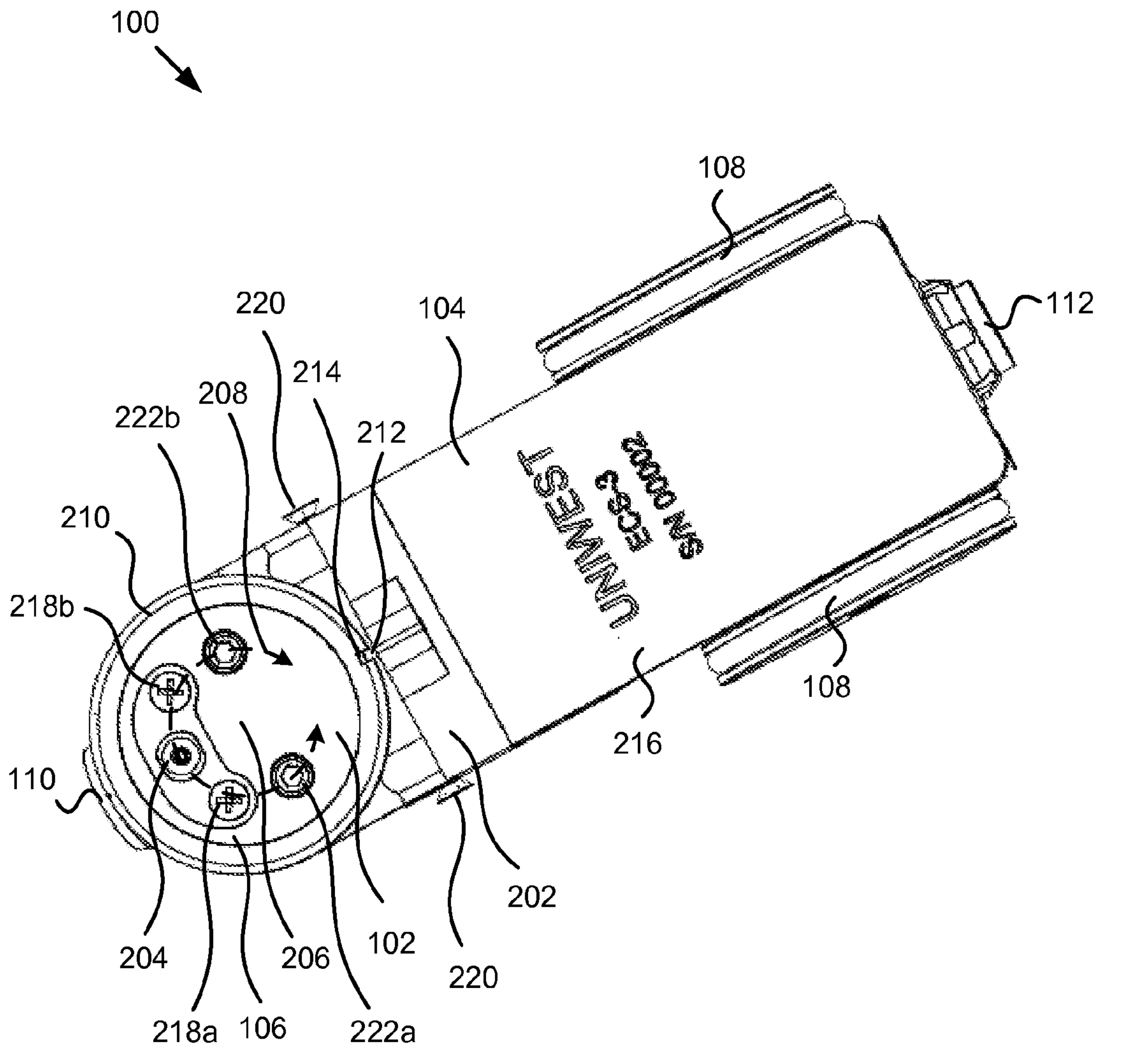
FIG. 2 is a bottom view illustrating another embodiment of an apparatus for maintaining normalcy of a sensor with respect to a structure.

FIG. 2 depicts one embodiment of a bottom view of the apparatus 100 with the housing 104 removed for clarity. In certain embodiments, the apparatus includes a chassis 216 which provides a support structure for mounting the internal components of the apparatus 100. Screws 220 are positioned on each side of the chassis 216 to couple the housing 104 to the apparatus 100.

As can be seen in FIG. 2, in certain embodiments the sensor 204 is positioned on the scanning surface 102 of the driven member 106 at a fixed radius from an axis of rotation 206 of the driven member 106. When the driven member 106 is rotated the sensor 204 travels around the axis of rotation 206 in the radius indicated by arrows 208. As the sensor 204 travels around the axis or rotation 206, the sensor 204 senses eddy currents in the scanned structure produced by a crack or imperfection in the surface of the scanned structure.

In certain embodiments, the sensor 204 is positioned on the driven member 106 and coupled to the scanning surface 102 by a pair of screws 218. In other embodiments, the sensor 204 may be integral with the driven member 106. Another pair of screws 222*a*, 222*b* couple a capping member 302 (FIG. 3) to the driven member 106 as discussed below.

In certain embodiments a guard ring 210 is disposed around an outer periphery of the driven member 106. The guard ring 210 protects the scanning surface 102 of the driven member 106 and the sensor 204 from damage as the driven member 106 is rotated. In certain embodiments, the guard ring 210 extends beyond the plane of the scanning surface 102 such that any obstacles encountered on the scanned surface, such as a rivet or other raised object, first contacts the guard ring 210. In one embodiment, the guard ring 210 remains substantially free from rotation and the driven member 106 rotates within the guard ring 210. In other embodiments the guard ring 210 may co-rotate with the driven member 106.

In certain embodiments, such as where the guard ring 210 is substantially rotationally stationary, a guard ring engaging element 212 engages a guard ring slot 214 to stop rotation of the guard ring 210. The guard ring slot 214, in certain embodiments, is elongated in a lengthwise direction substantially perpendicular to the axis of rotation 206 of the driven member 106. In the embodiment illustrated in FIG. 2 the guard ring 210 includes the guard ring slot 214 and the guard ring engaging element 212 is coupled to the chassis 216. In other embodiments, the chassis 216 may include a slot (not shown) and the guard ring 210 may include an engaging element (not shown) that engages the slot (not shown) in the chassis 216 to stop rotation of the guard ring 210.

In certain embodiments, a gliding flange 202 extends beyond the plane of the scanning surface 102 of the driven member 106 to position the scanning surface 102 a predefined distance away from a scanned structure when the apparatus 100 is in use. In one embodiment the wheels 108 also extend beyond the plane of the scanning surface 102 of the driven member 106.

Figure 3:
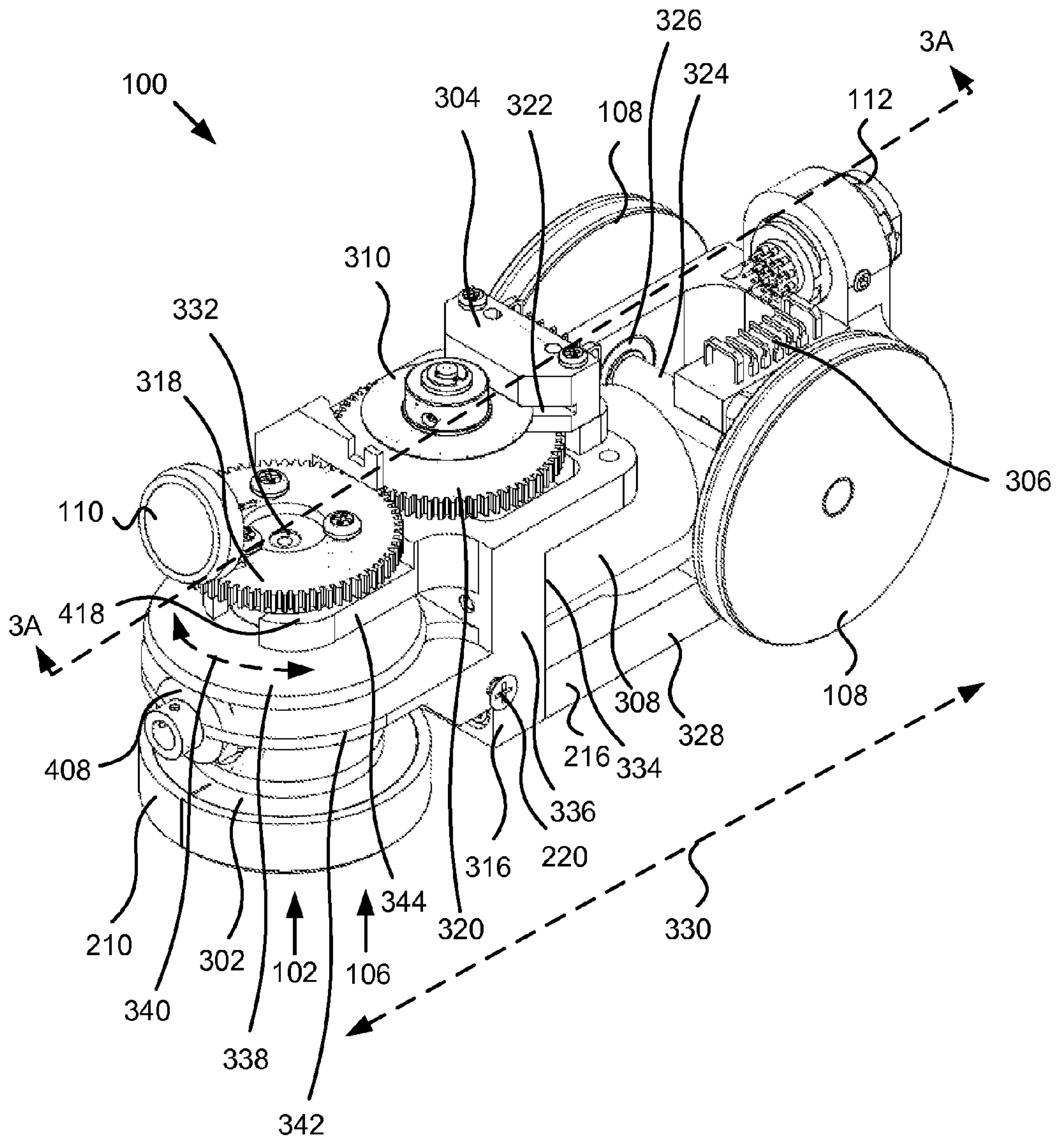
FIG. 3 is a perspective view illustrating one embodiment of an apparatus for maintaining normalcy of a sensor with respect to a structure with the housing removed.

FIG. 3 depicts another embodiment of a top perspective view of the apparatus 100 with the housing 104 removed for clarity. In certain embodiments, the apparatus 100 includes a first encoder 304, a second encoder 306, a motor 308, an encoder wheel 310, a chassis 216, a driving member 332, and a driven member 106.

As discussed above, the chassis 216, in certain embodiments, provides a support structure for mounting the internal components of the apparatus 100. Thus, in certain embodiments the wheels 108, the motor 308, the first encoder 304, and the second encoder 306 are supported by the chassis 216. In one embodiment, the wheels 108 are coupled to one another by an axle 324. The axle 324 is positioned through and rotates within holes 326 in a rear portion 328 of the chassis 216.

The chassis 216, in certain embodiments, includes a front portion 316 and a rear portion 328. As further discussed below with reference to FIG. 4, a motor 308 is positioned on the rear portion 328 of the chassis 216 and is rotatably engaged with a driving member 332. The engagement between the motor 308 and the driving member 332 causes the driving member 332 to rotate when the motor 308 is powered on.

The driving member 332 is engaged with the driven member 106 by a first and a third engaging element (discussed below with reference to FIGS. 6-8) at one end of the driving member 332 to facilitate three-dimensional adjustment of the orientation of the driven member 106 with respect to the driving member 332. The three-dimensional adjustment of the orientation of the driven member 332 relative to the driving member 106 facilitates movement of the driven member 332 about an infinite number of axes of rotation such that the driven member maintains normalcy with respect to a scanned structure. That is, by adjusting the three-dimensional orientation of the driven member 106 with respect to the driving member 332, the scanning surface 102 of the driven member 106 can be maintained parallel with a surface of a scanned structure even if the gliding flange surface is not.

In certain embodiments, the driving member 332 and the driven member 106 are also coupled to one another by a second and a fourth engaging element (discussed below with reference to FIGS. 6-8). Engagement between the second and a fourth engaging element facilitates co-rotation of the driving member 332 and the driven member 106.

The driving member 332 is coupled to a first gear spur 318 such that rotation of the driving member 332 rotates the first gear spur 318. The first gear spur 318 engages a second gear spur 320 that is coupled to an encoder wheel 310. The encoder wheel 310 is received within a slot 322 in the first encoder 304. Rotation of the driving member 332 causes encoder wheel 319 to rotate within the slot 322 in the first encoder 304. Thus, a rotational force of the motor 308 causes the driven member 106 as well as the encoder wheel 319 to rotate. The first encoder 304 is an electro-mechanical device that converts an angular position of the driving member 332 to an analog or digital code to position stamp the sensor's 204 rotational path as it travels around the axis of rotation 206 of the driven member 106. In certain embodiments, the first encoder 304 logs the position of the sensor 204 to less than one degree as the sensor 204 rotates.

A second encoder wheel (not show) is coupled to the axle 324 such that the second encoder wheel (not shown) co-rotates with the axle 324 as the apparatus 100 is moved in the directions indicated by arrow 330. The second encoder wheel (not shown) is received within a slot (not shown) in the second encoder 306. The second encoder 306 position stamps the linear position of the apparatus 100 as it is moved along the linear axis in the direction indicated by arrow 330. In certain embodiments, the second encoder 306 is substantially similar to the first encoder 304.

In one embodiment, the processed eddy current data from the sensor 204 along with the sensor position data from the first encoder 304 and the linear position data from the second encoder 306 is sent to the data interpretation module 126. The data interpretation module 126 converts data from the first encoder 304 identifying the radial and phase position of the sensor 204 as it passes around the axis of rotation 206 of the driven member 106 to Cartesian coordinates $x'$ and $y'$ in an X-Y plane. The data interpretation module 126 also converts data from the second encoder 306 identifying the linear position $x''$ and $y''$ of the apparatus 100 in the X and Y axis of the X-Y plane. The $x''$ coordinate and the $y''$ coordinate from the second encoder are added to the $x'$ coordinate and the $y'$ coordinate to determine $x'''$ and $y'''$ coordinates according to the following equations: $x'''=x'+x''$ and $y'-=y'+y''$. The data interpretation module 126 associates the $x'''$ and $y'''$ coordinates with instantaneous eddy current signals from the sensor 204. The association between the $x'''$ and $y'''$ coordinates and the eddy current signals allows the data interpretation module 126 to create a two dimensional image of the rivet or other fastener that is being scanned. The image also shows any cracks or imperfections in the surrounding structure through which the rivet or other fastener is positioned. As discussed above, in certain embodiments, the data interpretation module 126 includes a display or printer that displays or prints the image of the rivet or other fastener along with the surrounding structure.

Figure 4:
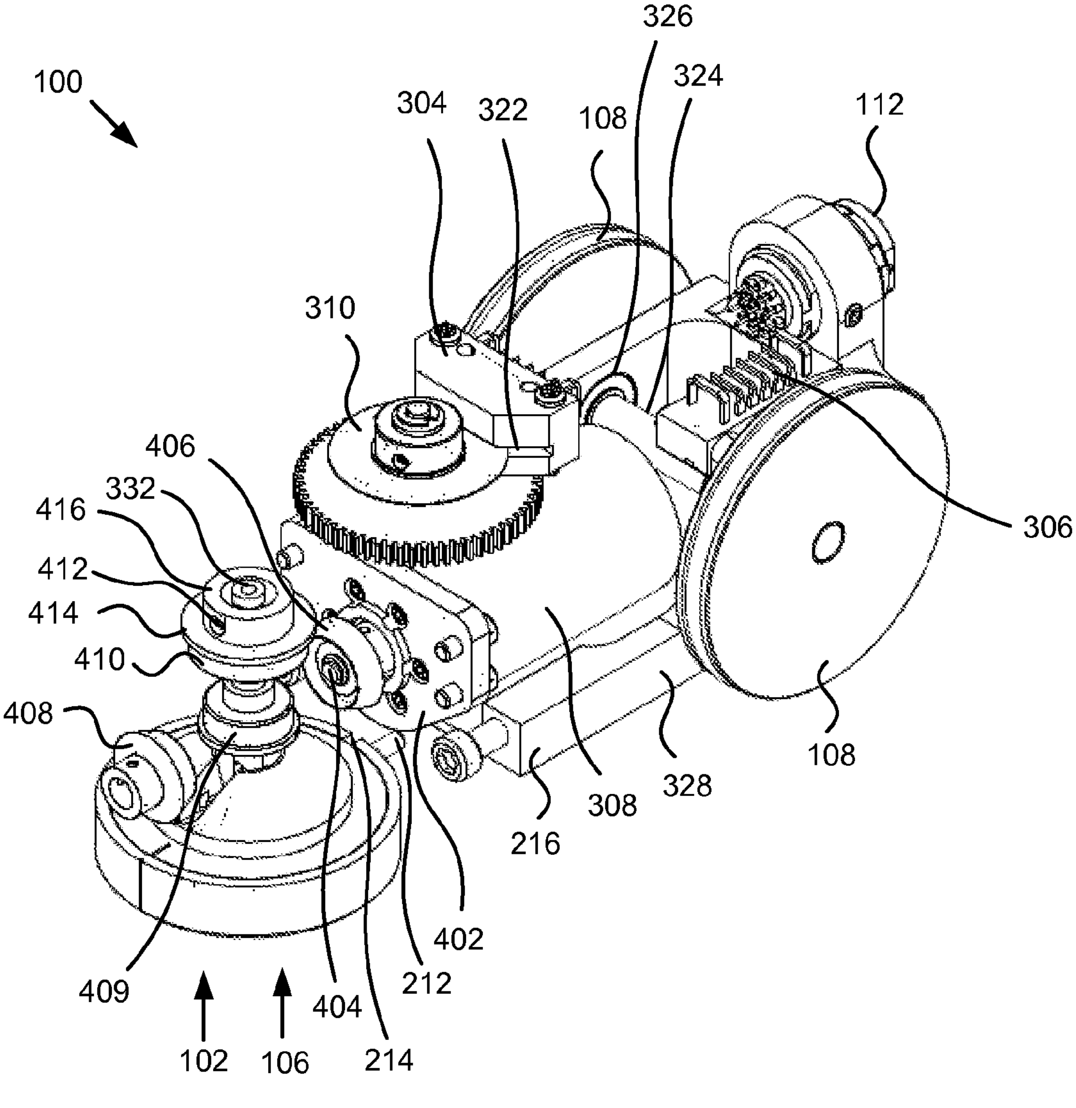
FIG. 4 a perspective view illustrating another embodiment of an apparatus for maintaining normalcy of a sensor with respect to a structure.

FIG. 4 depicts a perspective view of one embodiment of the apparatus 100 for maintaining normalcy of a sensor with respect to a structure. The embodiment illustrated in FIG. 4 the housing 104 and the front portion 316 of the chassis 216 have been removed for clarity. The first gear spur 318 has also been removed for clarity.

In one embodiment, the apparatus 100 includes a motor mount 402 that is coupled to a vertical wall 336 (see, e.g., FIG. 3) on the front portion 316 of the chassis 216. The motor 308 is coupled to the motor mount 402 to support the motor 308. A drive shaft 404 extends from the motor 308 through motor mount 402 and the vertical wall 336 on the front portion 316 of the chassis 216.

In certain embodiments, a pinion gear 406 is coupled to the end of the drive shaft 404. Referring to FIG. 3, a beveled gear 338 is coupled to the driving member 332. The pinion gear 406 engages the beveled gear 338 to rotate the beveled gear 338 in the direction indicated by arrows 340. Because the beveled gear 338 is coupled to the driving member 332, the driving member 332 also rotates. Engagement between the driving member 332 and the driven member 106 operates to rotate the driven member 106 when the driving member 332 is rotated.

In certain embodiments, a balancing gear 408 is positioned within a first flange 342 (see, e.g., FIG. 3) extending from the front portion 316 of the chassis 216. The balancing gear 408 is coupled to a shaft (not shown) on the inside of the housing 104 and rotates around the shaft. The balancing gear 408 is positioned opposite the pinion gear 406 to balance the load placed on the beveled gear 338 and to maintain contact between the pinion gear 406 and the beveled gear 338 such that contact between the pinion gear 406 and the beveled gear 338 is consistent.

In certain embodiments, the front portion 316 of the chassis 216 also includes a second flange 344 extending from the front portion 316 of the chassis 216 at a position substantially above the first flange 342. A first bearing member 409 is received within the first flange 342 and a second bearing member 410 is received within the second flange 344. The first bearing member 409 and the second bearing member 410 maintain the driving member 332 substantially perpendicular to a longitudinal axis of the apparatus 100 and facilitate rotation of the driving member 332 within the first and second flanges 342, 344.

Figure 5:
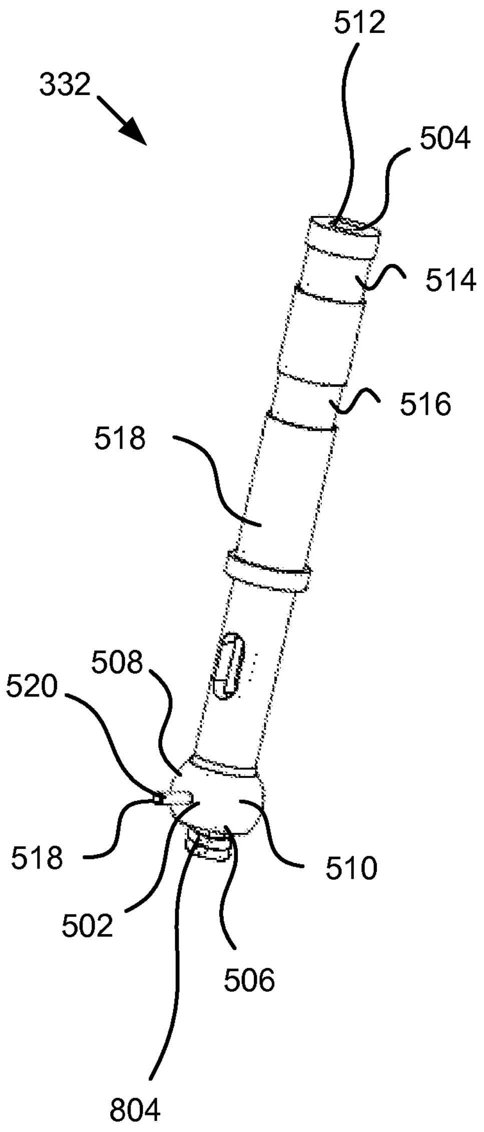
FIG. 5 is a perspective view illustrating one embodiment of a driving member of an apparatus for maintaining normalcy of a sensor with respect to a structure.

FIG. 5 depicts a perspective view of one embodiment of the driving member 332. In certain embodiments, the driving member 332 includes an elongated shaft 518 having a first end 504 and a second end 506. In certain embodiments, the driving member 332 is substantially hollow. In the embodiment illustrated in FIG. 5 the driving member 332 is substantially cylindrical. Electrical leads (not shown) are passed through the inner space 512 in the driving member 332 to power the sensor 204 and to communicate feedback signals from the sensor 204 to the data interpretation module 126.

Referring to both FIGS. 4 and 5, in certain embodiments the second bearing 410 includes a lip 414 that rests on a top surface 418 of the second flange 344. A spacer washer 416 is positioned above the second bearing 410. The spacer washer 416 includes a set screw that engages a first recess 514 in the driving member 332 to keep the spacer washer 416 from being removed from the first end 504 of the driving member 332. The lip 414 of the second bearing 410 engages the top surface 418 of the second flange 344 to keep the second bearing 410 from slipping down on the driving member 332 towards the second end 506 of the driving member 332.

In certain embodiments, the driving member 332 includes a second recess 516. The second recess 516 receives a set screw (not shown) in the beveled gear 338 to engage the beveled gear 338 with the driving member 332 such that rotation of the beveled gear 338 operates to rotate the driving member 332.

In one embodiment, the second end 506 of the driving member 332 includes a first engaging element 508. In certain embodiments, the first engaging element 508 of the driving member 332 is a head 502 member that is semispherical, that is, in certain embodiments, at least a portion of the first engaging element 508 includes a convex surface 510.

Figure 6:
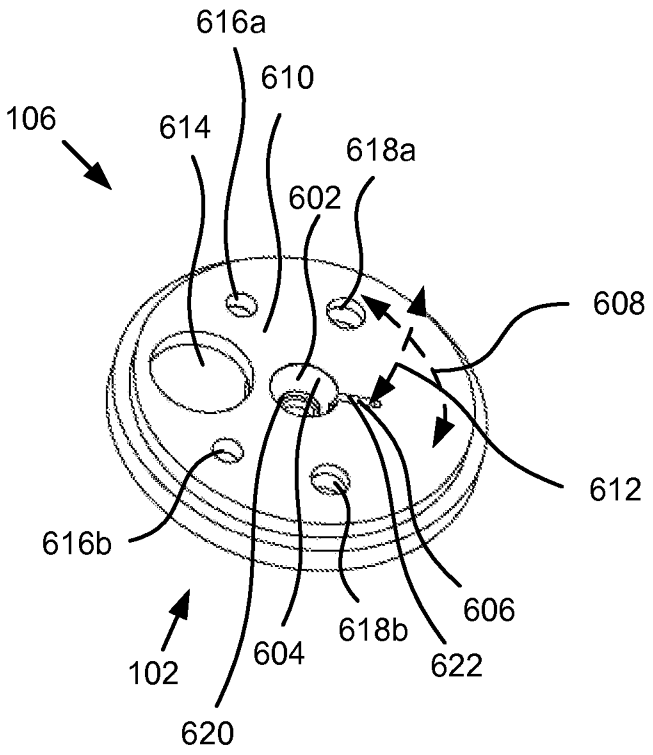
FIG. 6 is a perspective view illustrating one embodiment of a driven member of an apparatus for maintaining normalcy of a sensor with respect to a structure.

Referring now to FIG. 6, which depicts a top perspective view of one embodiment of the driven member 106, the driven member 106 includes a third engaging element 602. In one embodiment, the third engaging element 602 is a head receiving space 620 sized to receive the first engaging element 508. The third engaging element 602 is defined by an inner surface 604. In certain embodiments, at least a portion of the inner surface 604 defining the third engaging element 602 is concave such that the convex surface 510 of the first engaging element 508 is matingly received within the third engaging element 602.

When the first engaging element 508 is received within the third engaging element 602, the concave shape of the third engaging element 602 and the convex surface 510 of the first engaging element 508 facilitates three-dimensional adjustment of the orientation of the driven member 106 with respect to the driving member 332. Thus, engagement between the first engaging element 508 (the head 502) and the third engaging element 602 (the head receiving space 620) allows the scanning surface 102 of the driven member 106 to be positioned in a plane parallel to a surface on the scanned structure regardless of the orientation of the driving member 332.

While the embodiments illustrated in FIGS. 5 and 6 depict the driving member 332 as including the first engaging element 508 (the head 502) and the driven member 106 as including the third engaging element 602 (the head receiving space 620), one of skill in the art will recognize that the location of the first and third engaging elements may be reversed. That is, in certain embodiments the driven member 106 may include a head (not shown) and the driving member 332 may include a head receiving space (not shown).

In certain embodiments, the driving member 332 includes a second engaging element 518 and the driven member 106 includes a fourth engaging element 606. In the embodiments illustrated in FIGS. 5 and 6 the second engaging element 518 is a pinning member 520 and the fourth engaging element 606 is a slot 622 formed in the inner wall 604 defining the third engaging element 602. In certain embodiments, the slot 622 of the fourth engaging element 606 is elongated in a lengthwise direction substantially parallel to the axis of rotation 206 of the driven member 106.

In operation the pinning member 520 of the second engaging element 518 is received within the slot 622 of the fourth engaging element 606. When the pinning member 520 of the second engaging element 518 is received within the slot 622 of the fourth engaging element 606 rotational movement of the driven member 106 with respect to the driving member 332 is limited such that the driven member 106 co-rotates with the driving member 332. Thus, rotation of driving member 332 causes the second engaging element 518 to engage the fourth engaging element 606 to rotate the driven member 106 around the axis of rotation 206 in the direction indicated by arrows 608. Movement of the pinning member 520 of the second engaging element 518 within the slot 622 of the fourth engaging element 606 in a direction generally transverse a top surface 610 of the driven member 106 remains unrestricted. Thus, when the pinning member 520 of the second engaging element 518 is received within the slot 622 of the fourth engaging element 606, the pinning member 520 of the second engaging element 518 can move within the slot 622 of the fourth engaging element 606 in the direction indicated by arrows 612. The engagement arrangement between the first engaging element 508 (the head 502) and the third engaging element 602 (the head receiving space 620) as well as the engagement between the second engaging element 518 and the fourth engaging element 606 facilitates three-dimensional adjustment of the orientation of the driven member 106 and facilitates co-rotation of the driving member 332 and the driven member 106.

While the embodiments illustrated in FIGS. 5 and 6 depict the driving member 332 as including the second engaging element 518 and the driven member 106 as including the fourth engaging element 606, one of skill in the art will recognize that the location of the second and fourth engaging elements 518, 606 may be reversed. That is, in certain embodiments the driven member 106 may include a pinning member (not shown) and the driving member 332 may include a slot (not shown).

In certain embodiments, the driven member 106 may include a sensor receiving space 614 that receives the sensor 204. A pair of holes 616 receives screws 218 to couple the sensor 204 to the driven member 106. In other embodiments, the sensor 204 may be integral with the driven member 106 such that the sensor 204 and the driven member 106 are a single component. In another embodiment the sensor 106 may be mounted to the scanning surface 102 of the driven member 106 without extending through the driven member 106. In such an embodiment the sensor receiving space 614 may be unnecessary.

Figure 7A:
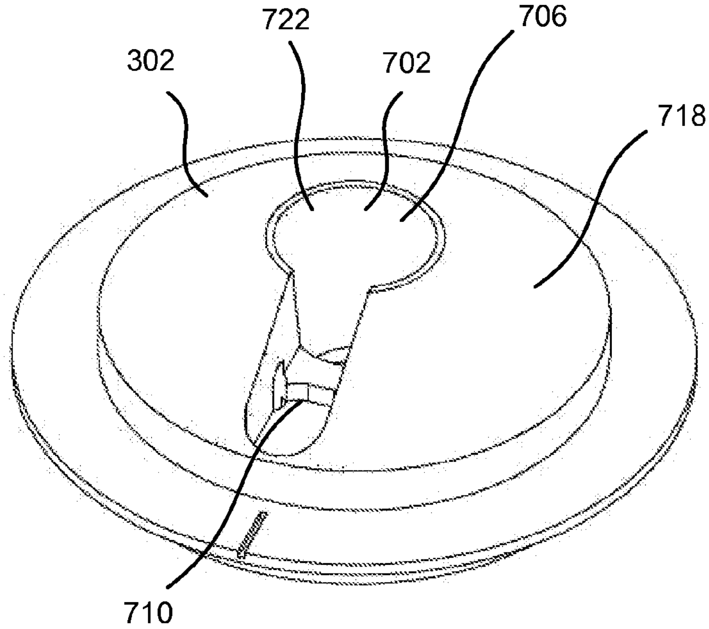
FIG. 7A is perspective view illustrating one embodiment of a shaft receiving surface of a capping member of an apparatus for maintaining normalcy of a sensor with respect to a structure.
Figure 7B:
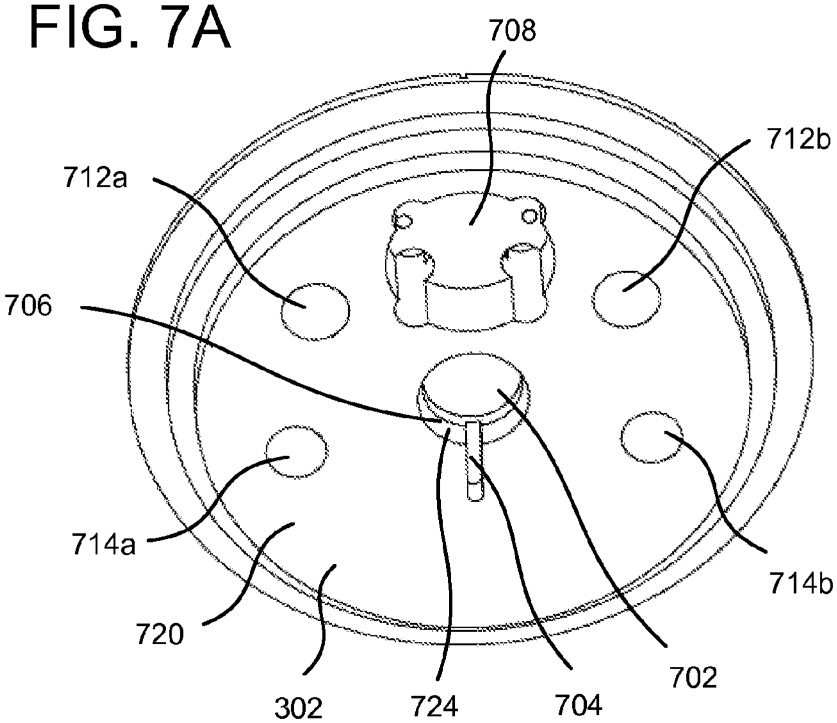
FIG. 7B is perspective view illustrating one embodiment of a head engagement surface of a capping member of an apparatus for maintaining normalcy of a sensor with respect to a structure.

FIGS. 7A and 7B depict one embodiment of a capping member 302 in accordance with the present subject matter. FIG. 7A is a top perspective view of the capping member 302 and FIG. 7B is a bottom perspective view of the capping member 302. In certain embodiments, when the capping member 302 is coupled to the driven member 106 the capping member 302 retains the first engaging element 508 (the head 502) within the third engaging element 602 (the head receiving space 620).

In certain embodiments, the capping member 302 includes a shaft receiving surface 718 positioned opposite a head engagement surface 720. When the capping member 302 is coupled to the driven member 106, the head engagement surface 720 is positioned adjacent to the top surface 610 of the driven member 106.

The capping member 302 includes a shaft receiving space 702 through which the shaft 518 of the driving member 332 is positioned. In certain embodiments, the shaft receiving space 702 is defined by an inner wall 706. The inner wall 706 of the shaft receiving space 702 includes a shaft receiving portion 722 and a head engagement portion 724. In one embodiment, the shaft receiving portion 722 of the inner wall 706 is substantially conical. That is, in one embodiment the diameter of the shaft receiving space 702 at the shaft receiving surface 718 is larger than the diameter of the shaft receiving space 702 at a position closer to the head engagement surface 720. As further discussed below, the conical shape of the shaft receiving portion 722 of the shaft receiving space 702 allows the shaft 518 of the driving member 332 to be positioned at an angle perpendicular to the scanning surface 102 of the driven member 106 as well as an angle other than perpendicular to the scanning surface of the driven member 106. The adjustability of the orientation of the driven member 106 with respect to the driving member 332 allows the scanning surface 102 of the driven member to be positioned parallel to a scanned surface even when the driving member 332 is not perpendicular to the scanned surface.

The shaft receiving space 702 in the capping member 302 has a minimum dimension less than a maximum dimension of the first engaging element 508 on the driving member 332 such that the capping member 702 maintains the first engaging element 508 within the third engaging element 602 on the driven member 106. In one embodiment, the head receiving portion 724 of the inner wall 706 is concave such that the convex surface 510 of the first engaging element 508 is matingly received within the shaft receiving space 602. In such an embodiment, the head receiving portion 724 of the inner wall 706 and the head receiving space 620 in the driven member 106 combine to create the head receiving space of the third engaging element 602. That is, in certain embodiments the head receiving space 620 of the driven member 106 defines the bottom portion of the third engaging element 602 and the head receiving portion 724 of the inner wall 706 in the capping member 302 defines the upper portion of the third engaging element 602. Thus, in one embodiment, the driven member 106 and the capping member 302 combine to form the third engaging element 602.

In certain embodiments, the shaft receiving space 702 includes a slot 704 formed in an inner wall 706 of the capping member 302. The slot 704 formed in the inner wall 706 of the capping member 302 communicates with the slot 622 of the fourth engaging element 606 formed in the inner wall 604 of the driven member 106. The pinning member 520 of the second engaging element 518 is movable between the slot 704 formed in the inner wall 706 of the capping member 302 and the slot 622 of the fourth engaging element 606 formed in the inner wall 604 of the driven member 106. The communication between the slot 704 in the capping member 302 and the slot 622 in the driven member 106 allows the pinning member 520 of the second engaging element 518 to travel between the slot 704 in the capping member 302 and the slot 622 in the driven member 106. The increased mobility of the pinning member 520 of the second engaging element 518 between the slot 704 in the capping member 302 and the slot 622 in the driven member 106 allows the driven member 106 to be positioned in a greater number of orientations.

In certain embodiments, the capping member 302 includes a sensor receiving space 708 that is sized to accommodate the sensor 204. In one embodiment, the shaft receiving surface 718 of the capping member 302 includes a sensor access cavity 710 which provides access to the sensor 204 for coupling electrical leads (not shown) to the sensor 204.

In one embodiment, the capping member 302 includes screw receiving holes 712 sized to receive screws 218 that couple the sensor 204 to the driven member 106. In certain embodiments, the screw receiving holes 712 are threaded such that screws 218 operate to both couple the sensor 204 to the driven member 106 as well as to couple the driven member 106 to the capping member 302. In other embodiments, the screw receiving holes 712 may simply accommodate screws 218 without being threaded to couple the driven member 106 to the capping member 302. In such an embodiment, holes 616 (FIG. 6) in the driven member 106 may be threaded to couple the sensor 204 to the driven member 106. In certain embodiments, the capping member 302 includes another set of screw receiving holes 714 that receive screws 222 to couple the driven member 106 to the capping member 302. In such an embodiment, the screws 222 are positioned through holes 618 in the driven member and engage threads in the screw receiving holes 714 in the capping member 302.

Figure 8:
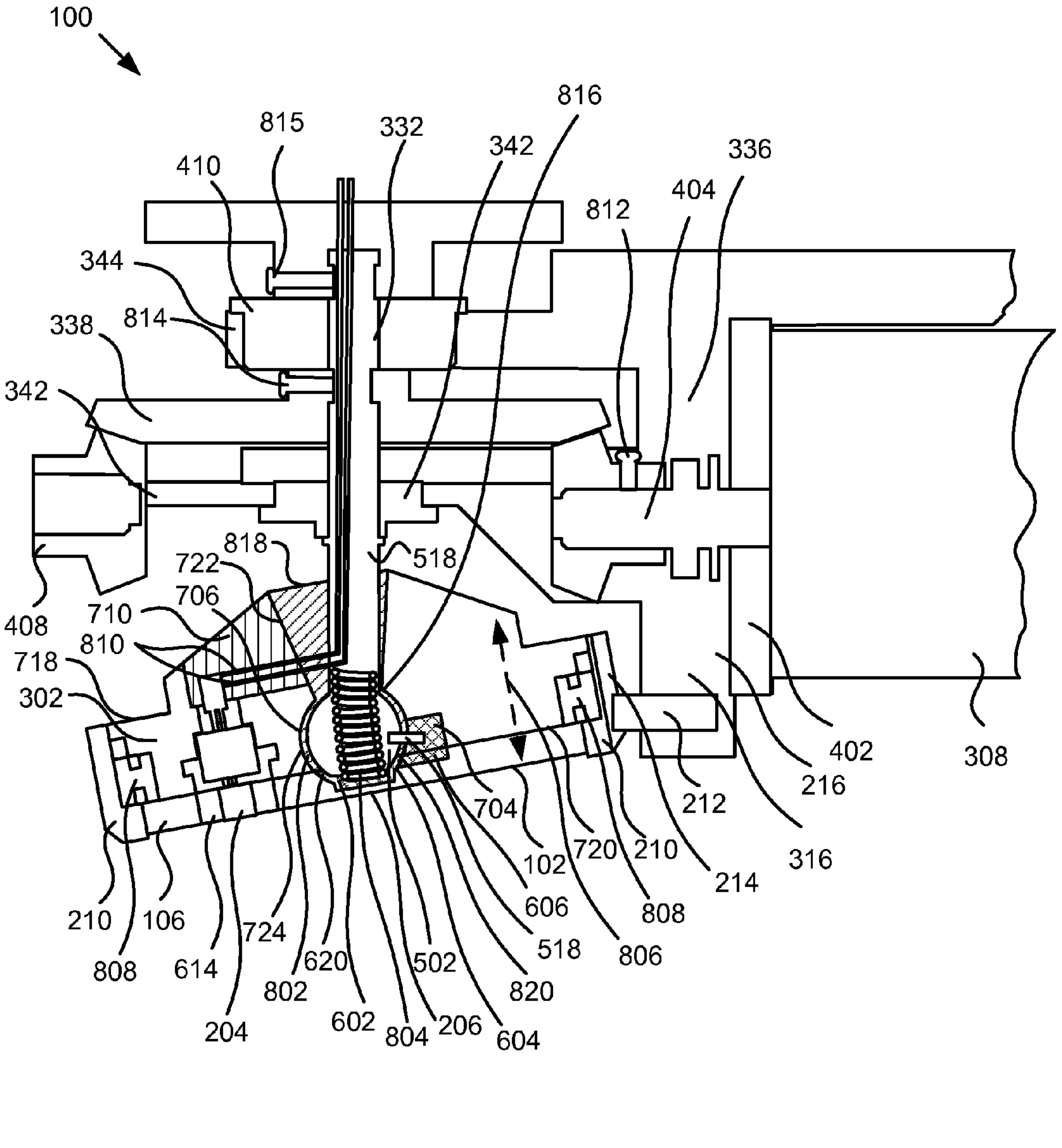
FIG. 8 is a partial cross-sectional view illustrating the apparatus of FIG. 3.

FIG. 8 depicts a partial cutaway view of an apparatus 100 for maintaining normalcy of a sensor with respect to a structure. The view depicted in FIG. 8 is taken along line 3A-3A of FIG. 3.

In certain embodiments, the engagement between the first engaging element 508 (the head 508) and the third engaging element 602 (the head receiving space 620) facilitates three-dimensional adjustment of the driven member 106 relative to the driving member 332. Thus, as depicted in FIG. 8, when the driving member 332 is positioned in a substantially vertical orientation, the driven member 106 can pivot in any three-dimensional orientation such that the scanning surface 102 remains parallel to a scanned surface.

In one embodiment, the third engaging element 602 includes the head receiving space 620 in the driven member 106 defined by the inner wall 604 of the driven member 106 as well as the space 802 in the head engagement portion 724 of the inner wall 706 in the capping member 302. In certain embodiments, the combination of the head receiving space 620 in the driven member 106 and the space 802 in the capping member 302 define a substantially spherical head receiving area that receives the substantially spherical head 502 of the driving member 332.

An interface 816 between the shaft receiving portion 722 and the head engagement portion 724 of the shaft receiving space 702 defines the shaft receiving portion 722 from the head engagement portion 724. Thus, in one embodiment, the shaft receiving portion 722 extends from a first opening 818 in the shaft receiving surface 718 to the interface 816 between the shaft receiving portion 722 and the head engagement portion 724 of the shaft receiving space 702. The head engagement portion 724 extends between a second opening 820 in the head engagement surface 720 and the interface 816 between the shaft receiving portion 722 and the head engagement portion 724 of the shaft receiving space 702.

The diameter of the first opening 818 is substantially larger than a diameter of the shaft receiving space 702 at the interface 816 between the shaft receiving portion 722 and the head engagement portion 724 such that the shaft receiving portion 722 of the shaft receiving space 702 is substantially conical.

The conical shape of the shaft receiving portion 722 of the shaft receiving space 702 accommodates the shaft 518 of the driving member 332 as the orientation of the driven member 106 relative to the driving member 332 is adjusted.

As discussed above, in certain embodiments, the inner wall 706 in the capping member includes a shaft receiving portion 722 and a head engagement portion 724. The head engagement portion 724 is semi spherical to matingly receive the head 502 of the driving member 332 such that the head 502 can pivot within the third engaging element 602. The shaft 518 of the driving member 332 is positioned through the shaft receiving portion 722 of the inner wall 706 in the capping member 302. The shaft receiving portion 722 of the inner wall 706 in the capping member 302 is substantially conical. When the driven member 106 is pivoted with respect to the driving member 332, the shaft 518 travels within the shaft receiving portion 722 of the inner wall 706 in the capping member 302 to facilitate positioning the scanning surface 102 of the driven member 106 in any of an infinite number of three-dimensional orientations.

A second engaging element 518 on the driving member 332 engages a fourth engaging element 606 in the driven member 106 to facilitate co-rotation of the driving member 332 and the driven member 106. In the embodiment illustrated in FIG. 8 the second engaging element 518 is a pinning member 520 and the fourth engaging element 606 is a slot 622 formed in the driven member 106 that communicates with a slot 704 formed in the capping member 302. In certain embodiments, both the slot 622 formed in the driven member 106 and the slot 704 formed in the capping member 302 are elongated in the lengthwise direction 806 substantially perpendicular to the axis of rotation 206 of the driven member 106.

The pinning member 520 of the second engaging element 518 can travel between the slot 704 in the capping member 302 and the slot 622 formed in the driven member 106. Additionally, the slot 704 in the capping member 302 and the slot 622 formed in the driven member 106 can rotate around the pinning member 520 of the second engaging element 518. Movement of the pinning member 520 of the second engaging element 518 in the lengthwise direction 806 as well as the rotation of the slots around the pinning member 520 of the second engaging element 518 allows the scanning surface 102 of the driven member 106 to be positioned in any three-dimensional orientation to maintain the scanning surface parallel to a scanned structure.

The pinning member 520 of the second engaging element 518 engages either or both of the slot 704 in the capping member 302 and the slot 622 formed in the driven member 106 to cause the driven member 106 to rotate when the driving member 332 is rotated. Thus, engagement between the second engaging element and the fourth engaging element 606 (either or both of the slot 704 in the capping member 302 and the slot 622 formed in the driven member 106) facilitates co-rotation of the driving member 332 and the driven member 106.

In one embodiment, a biasing member 804 is coupled to the driving member 332 and is engageable with the driven member 106 to bias the driven member 106 into a position that is substantially perpendicular to the driving member 332. Thus, in certain embodiments, when pressure is not applied to the driven member 106 the biasing member causes the driven member 106 to return to a position that is substantially perpendicular to the driving member 332.

A sensor 204 is positioned through a sensor receiving space 614 in the driven member 106. The top portion of the sensor 204 is received within sensor receiving space 708 in the capping member 302. As the driven member 106 is rotated, the sensor 204 travels around an axis of rotation 206 of the driven member 106 to scan the surface of a structure.

In certain embodiments, a guard ring 210 is disposed around an outer periphery of the driven member 106 and an outer periphery of the capping member 302. In one embodiment, the guard ring 210 extends beyond the scanning surface 102 to protect the sensor 204.

In one embodiment, a guard ring engaging element 212 is coupled to the front portion 316 of the chassis 216. In certain embodiments, the guard ring engaging element 212 is a pinning member that engages a guard ring slot 214 formed in the guard ring 210 to stop rotation of the guard ring 210 with respect to the driven member 106. Thus, in certain embodiments, the driven member 106 is rotatable within the guard ring 210 while the guard ring 210 remains substantially rotationally stationary. A bearing 808 is positioned between the capping member 302 and the driven member 106. The bearing 808 engages the guard ring 210 to facilitate rotation of the driven member 106 and the capping member 302 within the guard ring 210.

In one embodiment, the guard ring slot 214 is elongated in the lengthwise direction 806 and the guard ring engaging element 212 is movable along the guard ring slot 214 in the lengthwise direction 806. The guard ring 210 is also rotatable around the guard ring engaging element 212. Movement of the guard ring engaging element 212 along the guard ring slot 214 as well as the ability of the guard ring 210 to rotate around the guard ring engaging element 212 allows for three-dimensional adjustment of the driven member 106 to position the scanning surface 102 of the driven member in any three-dimensional orientation with respect to the driving member 332.

In certain embodiments, electrical leads 810 are coupled to the sensor 204. The electrical leads 810 provide power to, and feedback from the sensor 204. Thus, in certain embodiments, the electrical leads 810 are electrically coupled to the data interpretation module 126. The sensor access cavity 710 provides access to the electrical leads 810 and the sensor 204 to make the electrical coupling or to service the sensor 204.

A drive shaft 404 extends from the motor 308 through motor mount 402 and the vertical wall 336 on the front portion 316 of the chassis 216. The drive shaft 404 engages the pinion gear 406 to rotate the pinion gear 406 when the motor 308 is powered on. In certain embodiments, a set screw 812 extends through the pinion gear 406 and engages the drive shaft 404 to couple the pinion gear 406 to the drive shaft 404.

A beveled gear 338 is coupled to the driving member 332 by a set screw 814. The pinion gear 406 engages the beveled gear 338 to rotate the beveled gear 338. Because the beveled gear 338 is coupled to the driving member 332, the driving member 332 also rotates. A pair of bearing members 409 and 410 are positioned within the first and second flanges 342 and 344 respectively. The first bearing member 409 and the second bearing member 410 maintain the driving member 332 substantially perpendicular to a longitudinal axis of the apparatus 100 and facilitate rotation of the driving member 332 within the first and second flanges 342, 344.

A balancing gear 408 is positioned within a first flange 342 extending from the front portion 316 of the chassis 216. The balancing gear 408 is coupled to a shaft (not shown) on the inside of the housing 104 and rotates around the shaft. The balancing gear 408 is positioned opposite the pinion gear 406 to balance the load placed on the beveled gear 338 and to maintain contact between the pinion gear 406 and the beveled gear 338 such that contact between the pinion gear 406 and the beveled gear 338 is consistent.

A set screw 815 engages the driving member 332 to couple the first gear spur 318 to the driving member 332. Rotation of the driving member 332 causes the first gear spur 332 to rotate. As discussed above, the first gear spur 318 engages a second gear spur (not shown in FIG. 8). The second gear spur is coupled to an encoder wheel (not shown in FIG. 8) that engages an encoder to log the rotational position of the sensor 204 as it travels around the axis of rotation 204 of the driven member 106.

Figure 9:
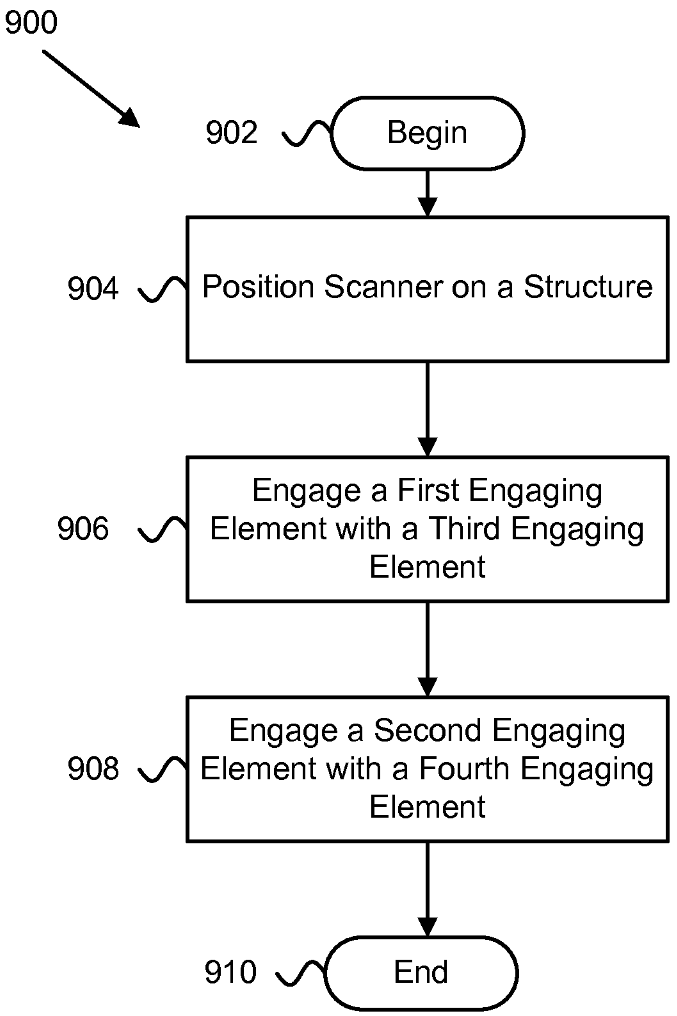
FIG. 9 is a schematic block diagram illustrating one embodiment of a method for maintaining normalcy of a scanner with respect to a structure.

FIG. 9 depicts one embodiment of a method 900 for maintaining normalcy of a sensor with respect to a structure. In certain embodiments, the method 900 utilizes an apparatus substantially similar to the apparatus 100 discussed above.

The method 900 begins 902 and a scanner 101 is positioned on a structure. In certain embodiments, the scanner 101 includes a driving member 332 and a driven member 106. In certain embodiments, the driven member 106 has a sensor 204 for sensing eddy currents in a surface on the scanned structure. In other embodiments, the sensor may sense other currents or feedback from the surface of the scanned structure.

A first engaging element 508 is engaged 906 with a third engaging element 602. In one embodiment, the first engaging element 508 is an element of the driving member 332 and the third engaging element 602 is an element of the driven member 106. In certain embodiments, one of the first engaging element 508 and the third engaging element 602 is a head 502 and the other of the first engaging element 508 and the third engaging element 602 is a head receiving space 620.

A second engaging element 518 is engaged 908 with a fourth engaging element 606. In one embodiment, the second engaging element 518 is an element of the driving member 332 and the fourth engaging element 606 is an element of the driven member 106. In certain embodiments, one of the second engaging element 518 and the fourth engaging element 606 is a slot 622 and the other of the second engaging element 518 and the fourth engaging element 606 is a pinning member 520.

In certain embodiments, engagement 906 between the first engaging element 508 and the third engaging element 602 facilitates three-dimensional adjustment of an orientation of the driven member 106 relative to the driving member 332. Engagement 908 between the second engaging element 518 and the fourth engaging element 606 facilitates co-rotation of the driving member 332 and the driven member 106. @.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to maintain normalcy of a sensor with respect to a structure, the apparatus comprising:

a driving member comprising a first engaging element and a second engaging element;

a driven member comprising a third engaging element and a fourth engaging element, the third engaging element being engaged with the first engaging element of the driving member and the fourth engaging element being engaged with the second engaging element of the driving member, wherein the driven member is rotatably drivable by the driving member; and a sensor coupled to the driven member;

wherein the engagement between the first and third engaging elements facilitates three-dimensional adjustment of the orientation of the driven member relative to the driving member, and the engagement between the second and fourth engaging elements facilitates co-rotation of the driving member and the driven member.

2. The apparatus of claim 1, wherein one of the first engaging element and the third engaging element comprises a head and wherein the other of the first engaging element and the third engaging element comprises a head receiving space.

3. The apparatus of claim 2, wherein the head receiving space is defined by an inner surface and wherein one of the second engaging element and the fourth engaging element comprises a slot formed in the inner wall, the slot elongated in a lengthwise direction substantially parallel to an axis of rotation of the driven member, wherein the other of the second engaging element and the fourth engaging element comprises a pinning member, the pinning member received within and movable along the slot in the lengthwise direction.

4. The apparatus of claim 2, further comprising a capping member having a shaft receiving space, wherein the capping member is coupled to one of the driving member and the driven member and wherein the other of the driving member and the driven member comprises a shaft positioned within the shaft receiving space, the shaft receiving space having a minimum dimension less than a maximum dimension of the head such that the capping member maintains the head within the head receiving space.

5. The apparatus of claim 4, further comprising a slot formed in an inner wall defining the shaft receiving space, wherein the slot formed in the inner wall of the capping member communicates with a slot formed in an inner wall in one of the driving member and the driven member such that a pinning member is moveable between the slot formed in the inner wall of the capping member and the slot formed in the inner wall in one of the of the driving member and the driven member.

6. The apparatus of claim 4, wherein at least a portion of the shaft receiving space includes a concave surface and wherein at least a portion of the head includes a convex surface, the concave portion of the shaft receiving space matingly nestable with the convex surface of the head.

7. The apparatus of claim 4, wherein the capping member includes a shaft receiving surface and a head engagement surface, the shaft receiving space extending between a first opening in the shaft receiving surface and a second opening in the head engagement surface, the shaft receiving space defined by an inner wall having a shaft receiving portion and a head engagement portion, the shaft receiving portion of the inner wall extending from the shaft receiving surface to an interface between the shaft receiving portion and the head engagement portion, wherein a diameter of the first opening is substantially larger than a diameter of the shaft receiving space at the interface between the shaft receiving portion and the head engagement portion such that the shaft receiving portion of the shaft receiving space is substantially conical, wherein the conical shaft receiving portion of the shaft receiving space accommodates the shaft as the orientation of the driven member relative to the driving member is adjusted.

8. The apparatus of claim 1, wherein the driven member includes a scanning surface, wherein the driven member adjusts to position the scanning surface in a plane parallel to a surface of a scanned structure.

9. The apparatus of claim 1, wherein the three-dimensional adjustment of the orientation of the driven member relative to the driving member facilitates rotation of the driven member about an infinite number of axes of rotation such that the driven member maintains normalcy with respect to a scanned structure.

10. The apparatus of claim 1, further comprising a biasing member coupled to the driving member and engageable with the driven member, wherein the biasing member biases the driven member into a position substantially perpendicular to the driving member.

11. The apparatus of claim 1, further comprising a guard ring disposed about an outer periphery of the driven member, the driven member being rotatable relative to the guard ring.

12. The apparatus of claim 11, further comprising a chassis, a guard ring engaging member, and a guard ring slot, the guard ring slot formed in one of the chassis and an outer wall of the guard ring, the guard ring slot elongated in a lengthwise direction substantially perpendicular to an axis of rotation of the driven member, the guard ring engaging element coupled to the other of the chassis and the guard ring, the guard ring engaging member being engageable with and movable along the guard ring slot in the lengthwise direction such that the guard ring is positioned in a fixed rotational position relative to the chassis.

13. The apparatus of claim 1, wherein the sensor comprises an eddy current sensor.

14. An apparatus to maintain a rotational path of an eddy current sensor parallel with a scanned structure, the apparatus comprising:

a driving member;

a driven member, the driven member having a substantially planar scanning surface, wherein the driven member is rotatably drivable by the driving member;

an eddy current sensor coupled to the driven member, the eddy current sensor sensing eddy currents within a structure; and a coupling between the driving member and the driven member, the coupling facilitating three-dimensional adjustment of an orientation of the substantially planar scanning surface of the driven member and facilitating co-rotation of the driving member and the driven member.

15. The apparatus of claim 14, wherein the driving member comprises a first engaging element and a second engaging element and wherein the driven member comprises a third engaging element and a fourth engaging element, the third engaging element being engaged with the first engaging element of the driving member and the fourth engaging element being engaged with the second engaging element of the driving member.

16. The apparatus of claim 15, wherein one of the first engaging element and the third engaging element comprises a head and wherein the other of the first engaging element and the third engaging element comprises a head receiving space, the head receivable within the head receiving space.

17. The apparatus of claim 15, wherein one of the second engaging element and the fourth engaging element comprises a slot formed in the head receiving space, the slot elongated in a lengthwise direction substantially parallel to an axis of rotation of the driven member, wherein the other of the second engaging element and the fourth engaging element comprises a pinning member the pinning member received within and movable along the slot in the lengthwise direction.

18. A method for maintaining normalcy of a sensor with respect to a structure, the method comprising:

positioning a scanner on a structure, the scanner comprising a driving member and a driven member, the driven member having a sensor;

engaging a first engaging element with a third engaging element, the first engaging element comprising an element of the driving member, the third engaging element comprising an element of the driven member;

engaging a second engaging element with a fourth engaging element, the second engaging element comprising an element of the driving member, the fourth engaging element comprising an element of the driven member; and rotating the driving member to rotate the driven member;

wherein engagement between the first engaging element and the third engaging element facilitates three-dimensional adjustment of an orientation of the driven member relative to the driving member;

wherein engagement between the second engaging element and the fourth engaging element facilitates co-rotation of the driving member and the driven member.

19. The method of claim 18, wherein one of the first engaging element and the third engaging element comprises a head and the other of the first engaging element and the third engaging element comprises a head receiving space.

20. The method of claim 18, wherein one of the second engaging element and the fourth engaging element comprises a slot and the other of the second engaging element and the fourth engaging element comprises a pinning member.

* * * * *